US008580102B2

(12) United States Patent
Ossei-Wusu et al.

(10) Patent No.: US 8,580,102 B2
(45) Date of Patent: Nov. 12, 2013

(54) METHOD FOR THE FAST MACROPORE ETCHING IN N-TYPE SILICON

(75) Inventors: Emmanuel Ossei-Wusu, Kiel (DE); Ala Cojocaru, Kiel (DE); Juergen Carstensen, Kiel (DE); Helmut Foell, Moenkeberg (DE)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 553 days.

(21) Appl. No.: 12/921,035

(22) PCT Filed: Feb. 28, 2009

(86) PCT No.: PCT/DE2009/000293
§ 371 (c)(1),
(2), (4) Date: Sep. 3, 2010

(87) PCT Pub. No.: WO2009/109176
PCT Pub. Date: Sep. 11, 2009

(65) Prior Publication Data
US 2011/0294302 A1 Dec. 1, 2011

(30) Foreign Application Priority Data
Mar. 4, 2008 (DE) .......................... 10 2008 012 479

(51) Int. Cl.
*C25F 3/12* (2006.01)
(52) U.S. Cl.
USPC ........................................ 205/674; 205/665
(58) Field of Classification Search
USPC ................................................ 205/655, 674
See application file for complete search history.

(56) References Cited

U.S. PATENT DOCUMENTS
7,031,566 B2  4/2006  Kochergin et al.

FOREIGN PATENT DOCUMENTS
DE  10 2004 011 394  9/2005

OTHER PUBLICATIONS

Cojocaru et al., "Fast Macropore Growth in n-type Silicon," Phys. Status Solidi C 6, No. 7, 1571-1574 (2009), published online Feb. 5, 2009.*
Föll et al., "Formation and Application of Porous Silicon", Materials Science and Engineering, R, 39, 2002, pp. 93-141.
Föll et al., "Properties of Silicon-Electrolyte Junctions and Their Application to Silicon Characterization", Applied Physics, A, 53, 1991, pp. 8-19.
Foca et al., "Smoothening the Pores Walls in Macroporous n-Si", ECS Transactions, 211th Meeting of the Electrochemical Society, Chicago, 6(2), 367, 2007.
Christophersen et al., "Macropore Formation on Highly Doped n-Type Silicon", Phys. Stat. Sol. (a), 182, 2000, pp. 45-50.
Bao et al., "Macropore Formation Without Illumination on Low Doped n-Type Silicon", Journal of the Electrochemical Society, 154, 2007, pp. D175-D181.

* cited by examiner

*Primary Examiner* — Nicholas A Smith
(74) *Attorney, Agent, or Firm* — Diederiks & Whitelaw, PLC

(57) ABSTRACT

Method for the electrochemical etching of macropores in n-type silicon wafers, using illumination of the wafer reverse sides and using an aqueous electrolyte, characterized in that the electrolyte is an aqueous acetic acid solution with the composition of $H_2O:CH_3COOH$ in the range between 2:1 and 7:3, with an addition of at least 9 percent by weight hydrofluoric acid.

9 Claims, 4 Drawing Sheets

METHOD FOR THE FAST MACROPORE ETCHING IN N-TYPE SILICON

CROSS-REFERENCE TO RELATED APPLICATIONS

This application represents a National Stage application of PCT/DE2009/000293 entitled "Method for Fast Macropore Etching in n-Type Silicon" filed Feb. 28, 2009, pending.

BACKGROUND OF THE INVENTION

The invention relates to a method for producing deep cylindrical macropores in n-type silicon by means of electrochemical etching using illumination of the reverse side.

Like other semiconductors, silicon can be provided with pores by electrochemically dissolving. A basic classification according to IUPAC norm (International Union of Pure and Applied Chemistry) into three classes is carried out according to the size of the pores; a distinction is made here between microporous silicon (pore diameter<2 nm), mesopores (pore diameter 2-50 nm) and macropores (pore diameter>50 nm). However, the IUPAC definition only applies to the pore diameters; the distance between pores is not addressed thereby as a matter of principle despite in practice mostly having similar sizes as the pore diameter.

No binding nomenclature exists regarding the shape or morphology of the pores. Among experts it is generally known that micropores exhibit a spongy morphology while meso and macropores are directed. In the case of macropores in particular perfectly cylindrical ("channel-like") pores can be produced, while mesopores rather have an angular ("coral-like") morphology.

Potential applications for macroporous silicon are for example photonic crystals, micro filter diaphragms, optical filters, fuel cells, or biochips. One of the established methods for etching macropores having a defined geometry and arrangement in conventional n-type silicon wafers comprises the electrochemical dissolution using an aqueous (aqu) electrolyte containing hydrofluoric acid (HF) using backside illumination (bsi). To obtain a better reproducibility of the pore-etching results, the illumination is controlled here as a matter of principle such that a predetermined etching current flows. Further details can be gathered from the publications H. Föll, M. Christophersen, J. Carstensen, and G. Hasse, "*Formation and application of porous silicon*", Mat. Sci. Eng. R 39(4), 93 (2002) and H. Föll, "*Properties of silicon-electrolyte junctions and their application to silicon characterization*", Appl. Phys. A 53, 8 (1991).

U.S. Pat. No. 7,031,566 for example discloses a method for electrochemically etching macropores in n-type silicon, where the wafers are etched using an aqueous electrolyte solution containing hydrochloric acid while their reverse side is illuminated.

Certain demands are placed on etching these pores referred to below as n-macropores (aqu, bsi) according to the intended use that can be very detailed in the particular case but usually always exhibit three parameters:
1. obtainable maximum depth $\alpha_{max}$ of the etched pores,
2. etch time $t_{etch}$ up to the desired depth $\alpha$, or, equivalent thereto, the mean etch rate $v_{etch} = \alpha/t_{etch}$,
3. the roughness $r_p$ of the pore walls, measured e.g. using an atomic force microscope (AFM) as "root mean square" (rms) of the course of the surface profile.

Further demands may exits beyond these, e.g. a pore diameter that is as constant as possible relative to the pore depth or a default of the cross-sectional shape of the pore (e.g. round—square). However these shall not be considered below.

A non-linear dependence exists between the three parameters mentioned above that is not fully understood to date. At most a few rules of thumb can be formulated so far, for example that high etch rates $v_{etch}$ and large maximum etch depths $\alpha_{max}$ represent "opposing" demands—if you want to etch deep, as a rule you have to etch slowly. Even in the case of very slow etching you will not be able to exceed certain etch depths. A simple relation in the form of $v_{etch} \times \alpha_{max} =$ const therefore also does not do justice to the complexity of the system. Something similar applies for the roughness $r_p$ of the pore walls. The assumption that is obvious per se that high etch rates cause rougher pore walls turns out not to be the case. Correlations between pore depth and pore-wall roughness may be assumed but are not known.

Given that today a need exists in practice for optimizing one or more of the three parameters mentioned there are no clear procedures. Moreover electrochemical pore etching is still limited, i.e. in the prior art these parameters do not progress beyond certain limits.

While fast growth is generally known for meso and micropores in n-type silicon, today's limit value for the etch rate for deep, cylindrical macropores amounts to about 1 micrometer/minute. Though it has already been attempted to increase the growth rate of conventional macropores using suitable, obvious measures, in particular by increasing the HF concentration or the temperature. However this only leads to higher growth rates in the initial phase and ultimately results in the loss of pore stability and the termination of pore growth (see FIG. 1).

The problem thus lies in the increase in the current component by the walls of a pore that have already formed; it is called the leakage current. The pore wall-surface that increases continually during etching causes a gradual shift in the ratio of leakage current from the pore walls to the photo-generated etching current from the pore tips toward larger values. On the one hand control of the pore geometry thereby becomes increasingly difficult as the pore depth grows. On the other hand the tendency can be observed when using a high HF concentration that from a certain pore depth it is above all the pore walls that are etched in the vicinity of the pore tips. The pore tips then widen—what ultimately destroys them—all pore tips grow together and form a so-called cavity. A low HF concentration in contrast leaves the pore walls stable for a longer time and permits to advance the pores into greater depths.

All experiences made so far cumulate in the rule that deep macropores having a good cylindrical geometry in n-type silicon can only be produced for HF concentrations in the range 2-5% and current densities between 1-10 mA/cm². In the best case, fast growing cylindrical macropores are today possible for small depths in the range of a few micrometers up to about 100 μm; deep cylindrical macropores (in the longitudinal range 300 μm-600 μm) cannot be formed using a high growth rate.

A remarkable exception from the rule mentioned is the inventors' patent specification DE 10 2004 011 394 B3 in which can also be found some of the data from FIG. 1 of this description. In the method described there the pores are however not etched using back illumination, but by means of an avalanche breakthrough at the pore tip which requires very high etching voltages to be applied and also presupposes a very high HF concentration. In this way deep, cylindrical macropores can be formed using etch rates up to a surprising value of 8 micrometers/minute. This however occurs in a special "pore growth mode" that was described for the first time in DE 10 2004 011 394 B3 and that in particular permits no control over the arrangement or the spacing of the pores. It is rather high pore densities that are required here since it is exactly the close proximity of the pores that guarantees the stability of the pore walls against the highly concentrated electrolyte. The usefulness of this accelerated etching is insofar limited above all to producing perforated diaphragms having a high pore density.

The pore depth $\alpha_{max}$ that can be achieved as a maximum for n-macropores (aqu, bsi) at an HF concentration of around 5% by weight amounts to 400-500 micrometers. However special measures are to be planned here, e.g. lowering the temperature from around 20° C. to around 10° C. during etching and continually increasing the applied voltage from 0.5V to 0.6V. At the same time, a widening of the pore diameter has to be counteracted by systematically decreasing the etching current. Pore depths in the range mentioned up to 500 micrometers can generally not be achieved unless care is taken to optimize etch rate and pore-wall roughness at the same time. In the end, mean etch rates up to 1 μm/min and wall roughnesses in the range of about 50 nm rms will have to be expected.

The person skilled in the art knows that the etch process is very sensitive to very small deviations from optimum time curves. Usually the expedient process window is very small and has to be determined again from scratch on a case by case basis. On top of this admixtures to the electrolyte can be helpful, e.g. surfactants in small amounts or larger amounts of ethanol. In particular acetic acid is added often in small concentrations so as to improve wetting of the hydrophobic Si surface by the aqueous electrolyte. Basically only few details are known regarding this issue since as a rule they are not published.

To date there was little investigation of the pore-wall roughness; what are known are the results published by E. Foca, J. Carstensen, M. Leisner, E. Ossei-Wusu, O. Riemenschneider, and H. Föll, "Smoothening the pores walls in macroporous n-Si", ECS Transactions, 211th Meeting of The Electrochemical Society, Chicago 6(2), 367 (2007). It is shown there that a reduction in the wall roughness—important for optical applications—can be achieved without the maximum pore depth suffering, in that different alcohols (methanol, ethanol, propanol) are added to the electrolyte, but in general this has the tendency to further reduce the etch rate.

For cost reasons one will always attempt to keep the etch duration $t_{etch}$ in the range of usual single-process times, i.e. a few minutes. However etch depths of 400-500 μm are today associated with etch times of $t_{etch} \approx 500\text{-}800$ min. Therefore macroporous silicon can be utilized cost-effectively only to a limited extent.

SUMMARY OF THE INVENTION

The object of the invention is therefore to specify an improved method for producing deep cylindrical macropores in n-type silicon that permits an accelerated etch process with a constant or reduced pore-wall roughness and even up to larger pore depths.

The inventive method starts from the usual electrochemical etch process using back illumination and also likewise conventional etch parameters (etching voltage of the order of magnitude 1 V, current density between around 1 and 10 mA/cm², a constant temperature of around 20° C.). Only the electrolyte used is modified in terms of its composition. As has been shown by experiments, what is best suited for the accelerated production of deep, cylindrical pores is an electrolyte consisting of a water/acetic acid mixture as solvent having a mixing ratio $H_2O:CH_3COOH$ between 2:1 and 7:3 and an HF concentration in the region of 10 percent by weight HF (called acetic electrolyte for short below), which must appear outright absurd to the person skilled in the art.

For on the one hand the traditional function of the acetic acid is that of a wetting aid and—in larger concentrations as in wet-chemical etching—also that of a diluent, i.e. normally it is not believed to have any significant part in chemical reactions during the etch process.

On the other hand there are publications (Christophersen et al., "Macropore Formation on Highly Doped n-Type Silicon", Phys. Stat. Sol. 2000, 182, 1:45-50 and Bao et al., "Macropore Formation Without Illumination on Low Doped n-Type Silicon", Journal of The Electrochemical Society, 154, D175-D181, 2007) that already gave a hint that a high concentration of acetic acid in an HF-containing electrolyte might possibly act as an oxidant to etch in particular macropores electrochemically without back illumination, but the same publications neither present results in this respect nor can any hints be gathered there that this would succeed well.

The person skilled in the art would in fact would have to assume from the source material that the above-mentioned concentration of acetic acid in the electrolyte would either be without any effect or even counterproductive, for the ratio of silicon oxide formation to material dissolution and ablation anyway shifts toward oxide formation during pore etching with back illumination which puts a brake on pore growth. Adding an "oxidant" therefore makes even less sense.

In contrast the experiments that were conducted unexpectedly show the basic rule that the addition of acetic acid both strongly increases the maximum etch depth $\alpha_{max}$ relative to the previous maximum value (and not decreases it strongly as would have to be expected for a 10% HF solution in water), but at the same time does not reduce further the maximum etch rates $v_{etch}$ achieved so far (as would have to be expected without acetic acid) but increases them strongly. Moreover the temperature no longer has to be reduced—with the otherwise considerable effort and at significantly increased etch times). The absolute value of the etching voltage shows an offset with respect to the results without acetic acid, but the precise value of the voltage is relatively unimportant, i.e. there is now a much larger process window compared to the prior art.

It should be emphasized that one leaves the range of total optimization in the case of significant deviations of the respective concentrations of HF and acetic acid from the values or intervals mentioned above. At the same time this means that no systematic approach exists to start from the conventional electrolyte compositions to reach the optimum described only by gradually varying the respective concentrations of the individual substances. This has only be made possible by assuming a link between $CH_3COOH$ and HF that until now was never assumed and also cannot be explained here.

BRIEF DESCRIPTION OF THE DRAWINGS

The invention is explained below in even more detail using the drawings and two exemplary embodiments. In the drawings

DETAILED DESCRIPTION OF THE INVENTION

Figure 1:
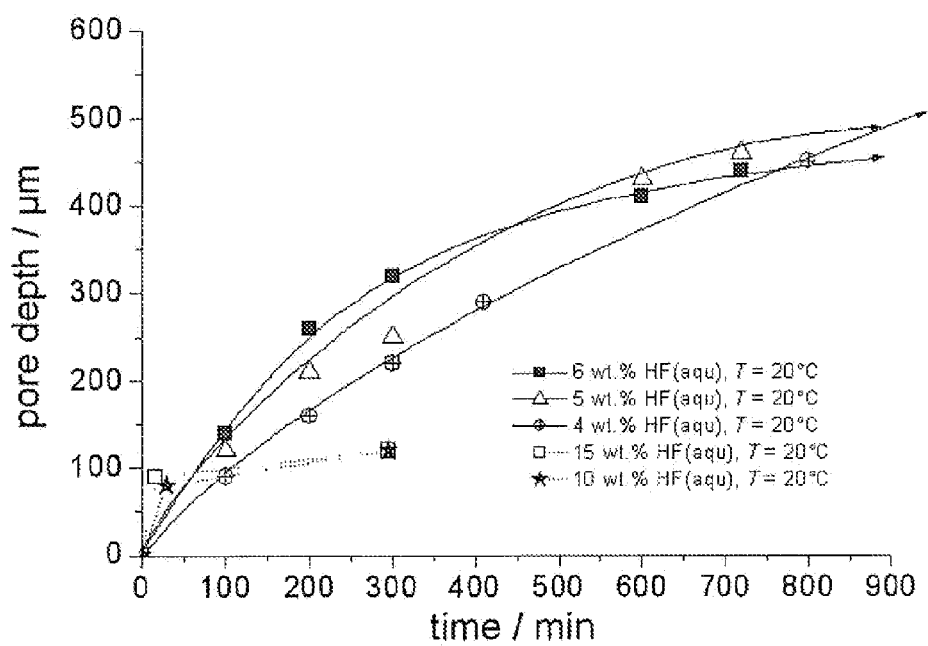
FIG. 1 shows a diagram for illustrating the pore depth achieved, plotted against the etch time required for it for different HF concentrations in water at 20° C. according to the prior art.

It has already been mentioned in the discussion of the prior art that the desire for an increased etch rate for deep pores cannot be tackled by simply increasing the HF concentration. FIG. 1 very clearly shows futility of this approach. It shows clearly that for higher HF concentrations etching on the one hand initially proceeds faster but on the other hand slows down earlier and the etch depth decreases that can be achieved ultimately. Data for 10% and 15% HF concentrations have also been plotted that can hardly be distinguished from one another and from which can be seen that only etch depths of up to around 100 micrometers can be achieved.

Embodiment 1

Figure 2:
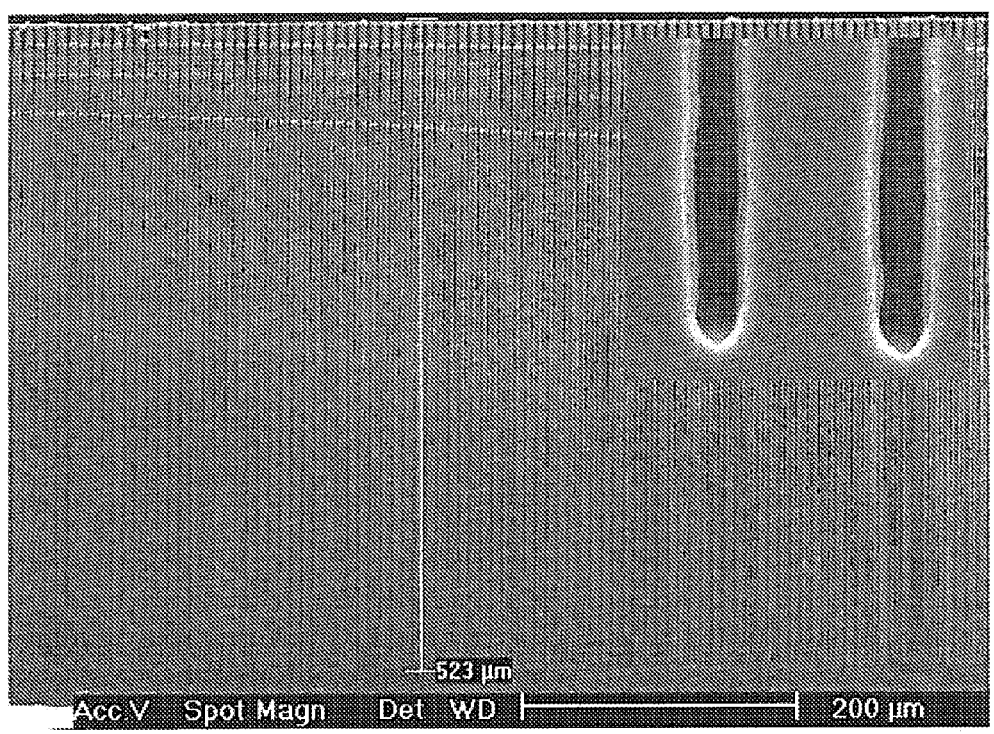
FIG. 2 shows the electron microscope image of a pore arrangement with an enlarged depiction of some pore tips, obtained according to the teachings of the invention.
Figure 3:
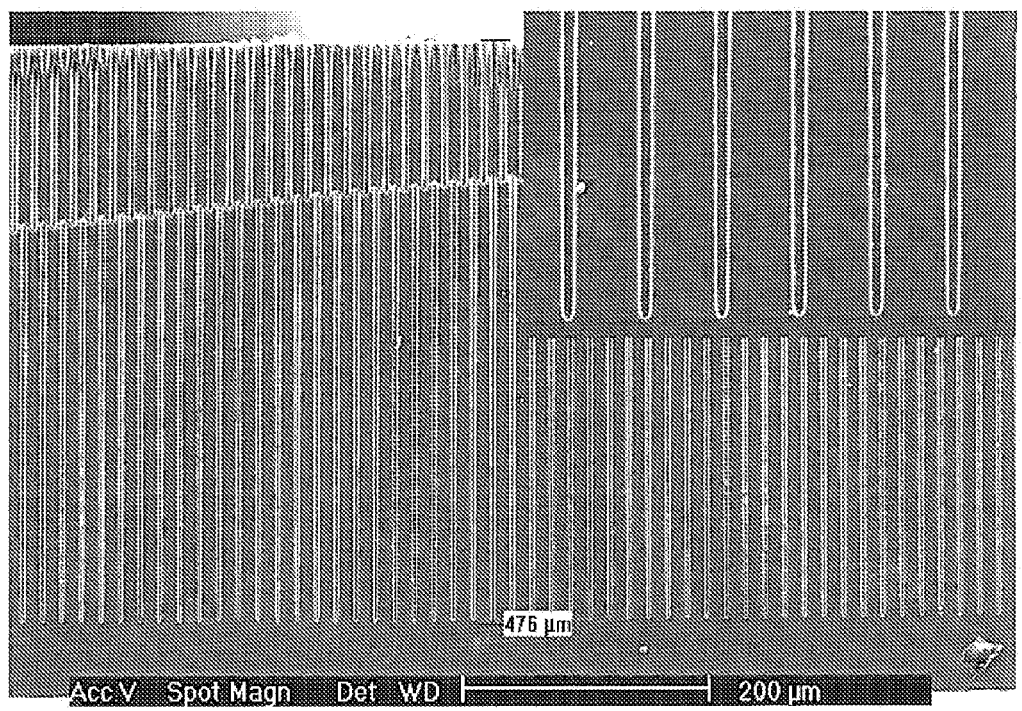
FIG. 3 shows an image of etched pores that were produced using the inventive method, the viscosity of the electrolyte in addition having been increased.

In case the acetic electrolyte is now used, the previous limitations that are generally recognized are obviously invalidated as the result shown in FIG. 2 proves. These are the specific conditions of the etching process for producing this result:
constant voltage 0.6V for the first 50 min, then increasing linearly to 1.5V until the end of the experiment; current 11 mA/cm$^2$ decreasing to 4 mA/cm$^2$, etch duration 325 min., Si(100) 20-30 Ω·cm, electrolyte temperature 20° C., 200 mL water+100 mL acetic acid+64 mL HF (48%). An electrolyte according to this recipe has 9.4 percent by weight HF. The results are very similar in a favorable range around 10 percent by weight HF, i.e. the results shown in FIGS. 2 and 3 are representative for the neighborhood of 10% HF.

Macropores are obtained that have a good geometry, mediocre wall roughness and a depth of 523 μm. Greater depths were possible but cannot be implemented using the wafers selected here (total thickness 550 μm). The total etch time is 325 min or 5.4 hours; the mean etch rate is therefore 1.6 μm/min, thus about 2.5 times faster than using conventional technology, using which pore depths of 520 μm can moreover hardly be reached.

It is also possible to produce macropores using HF concentrations clearly above 10%. This is successful in particular using acetic 15% electrolyte, the pore depth however being limited to 200 micrometers and the pores no longer exhibit very smooth walls (results not shown). Here, too, the growth basically shows the behavior of the curves from FIG. 1 for high HF concentrations. By adding the inventively large proportion of acetic acid, it is now possible to etch pores having twice the depth at an increased rate. If however the focus is on "beautiful" pores, then the HF concentration should preferably be set as an optimum to around 10% HF.

A preferred development of the invention consists in also adding a salt to the acetic electrolyte so as to increase its viscosity (in short "viscous acetic electrolyte" below). It has been shown that the addition of carboxylmethyl cellulose sodium salt (0.5 g-5 g for 1000 mL) is particular advantageous.

The potential benefits of increasing the viscosity have now to be regarded as prior art. It is known that this can produce pores having a reduced wall roughness—usually at the expense of losses in terms of etch rate. Occasionally viscous electrolytes can even achieve larger etch depths and rates than using the conventional aqueous electrolytes. However general statements are not possible on the basis of today's knowledge.

A viscous acetic electrolyte is thus worth a try, and experimental results are obtained that clearly exceed the results of conventional etch technologies. Using a viscous acetic electrolyte tailored to the respective task, both large etch depths and high etch rates can be achieved in conjunction with very smooth pore walls. Depending on the requirement profile, it may also be necessary to adapt the temperature and the voltage, but in principle the process window is still much larger than with the conventional technology.

Embodiment 2

FIG. 3 shows an image of the etch result already mentioned, with the viscous acetic 9.4% electrolyte. These are the parameters of the experiment in detail:
constant voltage 0.6V for the first 50 min, then increasing linearly to 1.5V until the end of the experiment; current 10 mA/cm$^2$ decreasing to 3 mA/cm$^2$, etch duration 320 min., Si(100) 20-30 Ω·cm, electrolyte temperature 20° C., 200 mL water+100 mL acetic acid+64 mL HF (48%)+2 g carboxylmethyl cellulose sodium salt, i.e. viscous acetic 9.4% electrolyte.

Macropores are obtained that have a good geometry, low wall roughness and a depth of 476 μm. Compared to the embodiment 1, the etch depth is now somewhat reduced, but then the roughness is less as can be gathered from the inlay image. The etch rate is on average still almost around 1.5 μm/min.

Figure 4:
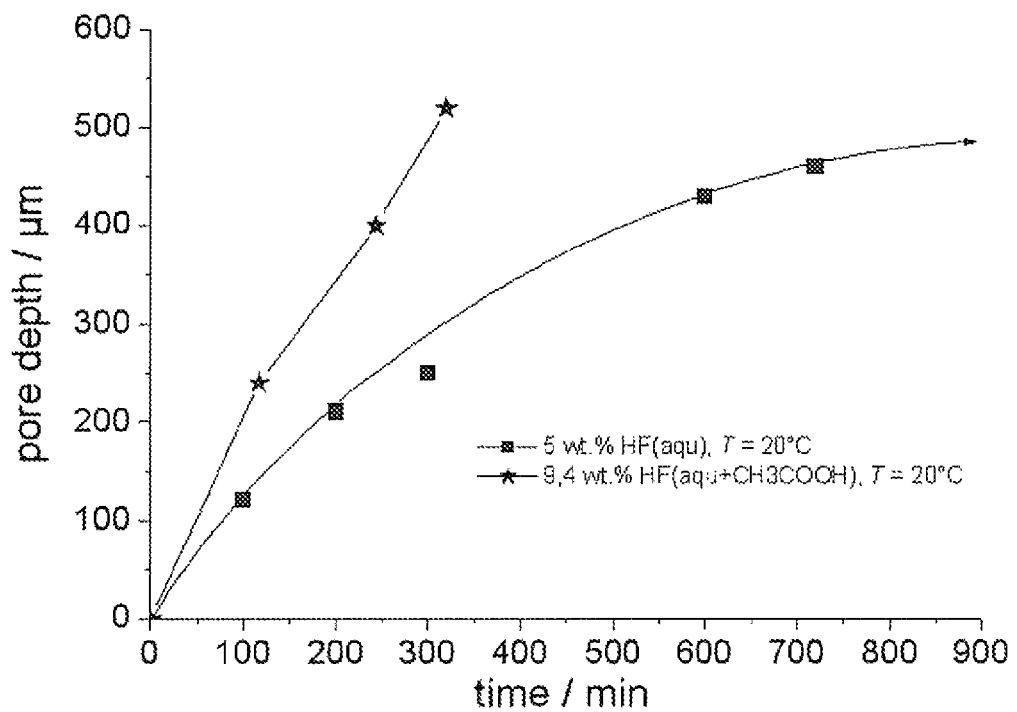
FIG. 4 shows a diagram analogous to FIG. 1, in which the results obtained using the invention are shown in a comparison with the "5% HF" curve from FIG. 1.

FIG. 4 finally shows measurement values for pore depths and etch duration analogous to FIG. 1 that were obtained using the inventive method. The continuous curve represents the "5% HF" curve from FIG. 1 as a comparison, that is the present optimum in the prior art.

The choice of the wafer used did not permit any deeper etching of the pores, but in particular in view of the rise in the measurement values for the acetic 9.4% electrolyte it may surely be expected that etch depths far beyond 500 μm can be realized.

Even the viscous acetic 9.4 electrolyte evidently permits larger etch depths than to date. Even though part of the gain in the etch rate obtained by the invention is sacrificed in favor of "more beautiful" pores, even here the situation is recognizably better than it seemed at all possible to date.

In summary this is the teaching of the invention:
Whoever wants to produce n-macropores (aqu, bsi) fast and deep, should add about 30% acetic acid to the, electrolyte and increase the HF concentration to about 10%. The previous "5% sound barrier" has been breached. Whoever wants to produce n-macropores (aqu, bsi) that are deep and as smooth as possible, should do the same, in addition increase the viscosity and also take some time to choose the etch parameters with some care and matched to his objectives.

The invention claimed is:
1. Method for the electrochemical etching of macropores in n-type silicon wafers, using illumination of the wafer reverse sides and using an aqueous electrolyte, characterized in that the electrolyte is an aqueous acetic acid solution with the composition of $H_2O:CH_3COOH$ in the range between 2:1 and 7:3, with an addition of at least 9 percent by weight hydrofluoric acid.

2. Method according to claim 1, characterized in that for producing macropores fast having a depth up to 200 micrometers the electrolyte has an HF concentration between 9 and 15 percent by weight.

3. Method according to claim 2, characterized in that for producing macropores having a depth larger than 500 micrometers the electrolyte has an HF concentration between 9 and 11 percent by weight.

4. Method according to claim 1, characterized in that a viscosity-increasing salt is added to the electrolyte.

5. Method according to claim 4, characterized in that carboxylmethyl cellulose sodium salt is added to the electrolyte in a concentration between 0.5 g and 5 g for 1000 mL.

6. Method according to claim 2, characterized in that a viscosity-increasing salt is added to the electrolyte.

7. Method according to claim 6, characterized in that carboxylmethyl cellulose sodium salt is added to the electrolyte in a concentration between 0.5 g and 5 g for 1000 mL.

8. Method according to claim 3, characterized in that a viscosity-increasing salt is added to the electrolyte.

9. Method according to claim 8, characterized in that carboxylmethyl cellulose sodium salt is added to the electrolyte in a concentration between 0.5 g and 5 g for 1000 mL.

\* \* \* \* \*